United States Patent [19]
Reddy et al.

[11] Patent Number: 5,448,529
[45] Date of Patent: Sep. 5, 1995

[54] HIGH SPEED AND HIERARCHICAL ADDRESS TRANSITION DETECTION CIRCUIT

[75] Inventors: Chitranjan N. Reddy, Milpitas; Ajit Medhekar, San Jose, both of Calif.

[73] Assignee: Alliance Semiconductor Corporation, Del.

[21] Appl. No.: 341,392

[22] Filed: Nov. 17, 1994

[51] Int. Cl.$^6$ ............................................... G11C 8/00
[52] U.S. Cl. ............................. 365/233.5; 365/230.08; 327/14
[58] Field of Search ............ 365/233.5, 230.08, 189.05, 365/194, 230.06, 233; 327/14; 326/93

[56] References Cited

U.S. PATENT DOCUMENTS 4,592,028  5/1986  Konishi .......................... 365/233.5
4,787,068  11/1988  Kihara ............................ 365/233.5

*Primary Examiner*—Joseph A. Popek
*Attorney, Agent, or Firm*—Limbach & Limbach

[57] ABSTRACT

An address transition detection (ATD) circuit provides an address transition detection pulse in response to either a high-to-low or low-to-high external address transition. The ATD circuit includes an address buffer that translates an externally applied address signal into an internal address signal and its logical complement. Two delay chains, each of which includes inverters, capacitors, a NAND gate and a CMOS pass gate, combine with the address buffer and an n-channel pull-down transistor to provide the ATD circuit. The outputs of the CMOS pass-gates are connected to the gate of the pull-down transistor. The drain of the pull-down transistor serves as the local ATD node of a dual-load feedback controlled ATD pulse generator. The ATD local node is common to address buffers that select memory cells within a particular memory block. Address buffers responsible for switching between blocks have separate feedback-controlled ATD pulse generators in order to optimize the access time of the memory device.

3 Claims, 5 Drawing Sheets

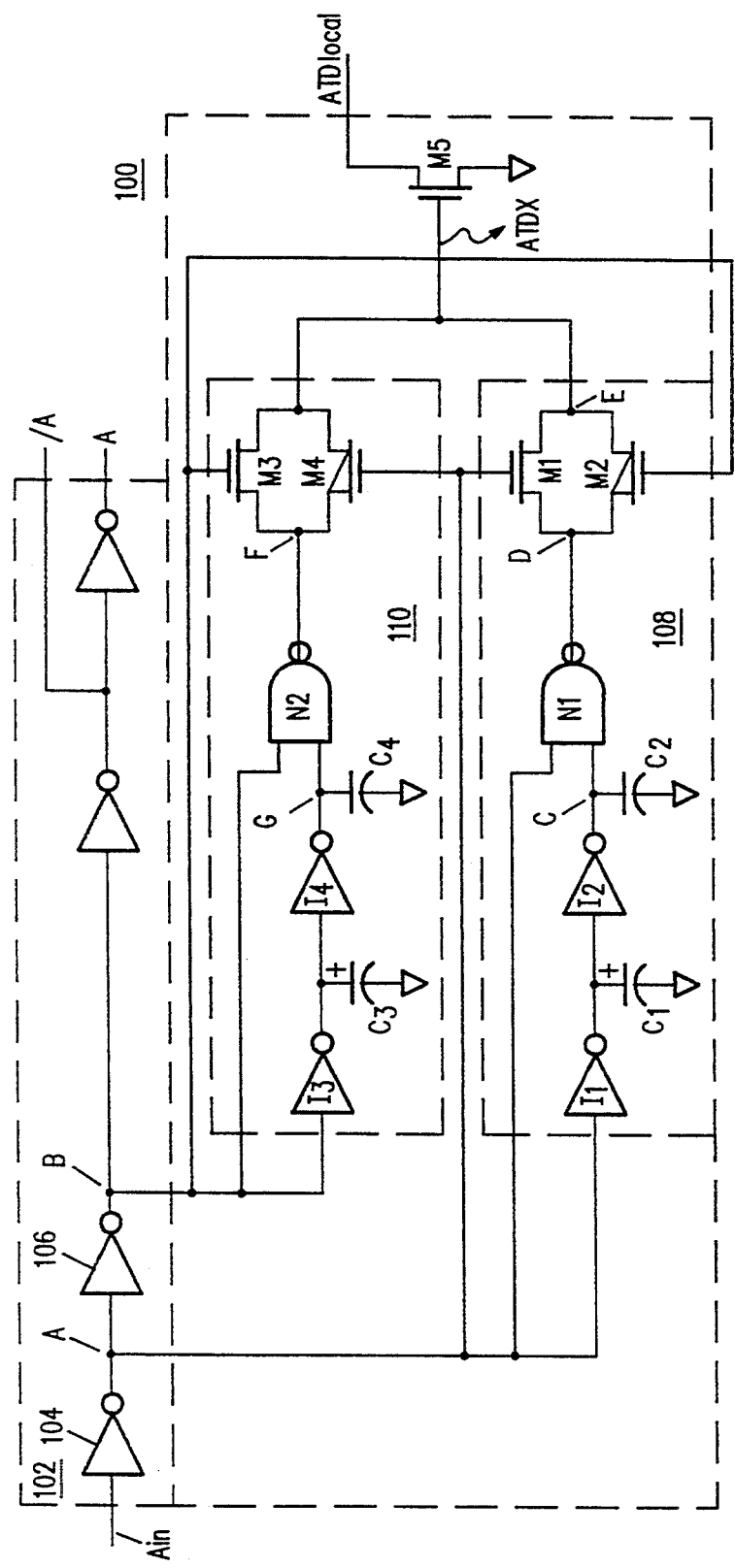
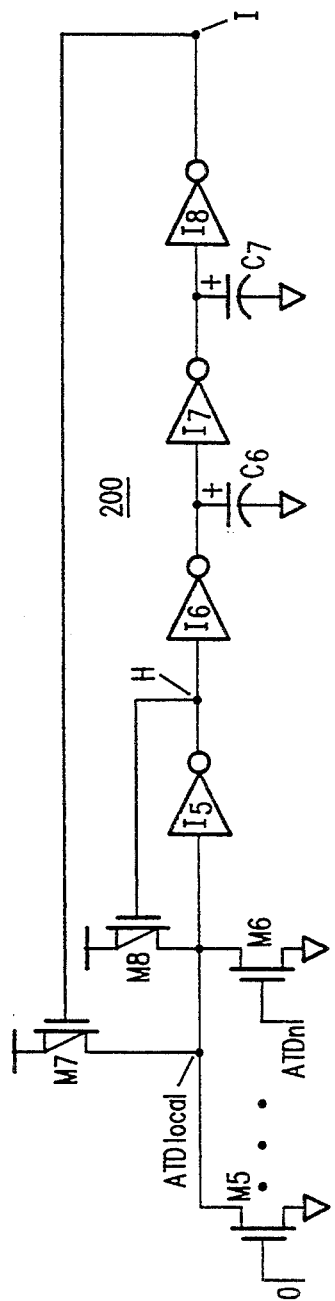
FIG. 2
FIG. 2A

HIGH SPEED AND HIERARCHICAL ADDRESS TRANSITION DETECTION CIRCUIT

FIELD OF THE INVENTION

The present invention relates to high-density, high-speed monolithic memories and, in particular, to an address transition detection (ATD) circuit that generates internal clocks for deselecting and selecting memory cells, equalizing critical nodes within the memory device, initiating data sensing and, ultimately, providing extremely fast access to addressed data.

BACKGROUND OF THE INVENTION

High-speed memory circuits require the generation of internal clocks that are initiated by the transition of an external address in order to deselect and select memory cells, equalize critical nodes and initiate sensing of addressed data. The access time of a memory circuit is, therefore, a direct function of the delay incurred in detecting an address transition and generating the internal clock, referred to below as an Address Transition Detection (ATD) pulse. An ATD pulse is generated by each of the individual address inputs to the memory; the individual pulses are then summed to generate a global ATD signal.

High-speed memories are often segmented into blocks of rows and columns of storage cells in order to improve access speed and reduce power dissipation. As a result of this segmented architecture, the ATD pulse requirements for address changes within a currently addressed memory block versus address changes that result in memory cell selections outside the currently addressed memory block are different. The ATD concepts utilized in the present invention optimize the internal clock global ATD signal based on whether a specific address change is an intra- or an inter-block change. This will be referred to below as an "hierarchical" ATD scheme.

FIG. 1 shows a conventional address buffer and ATD circuit 10 that utilizes a pair of delay chains 11 and 12 to feed a NOR gate network 13. The NOR gate network 13 provides an output which, after propagation through an intermediate summing NOR circuit, i.e., NOR gate 14 and buffer inverter 15 in FIG. 1, serves as an address transition detection pulse ATDx.

As shown in FIG. 1A, each of the n address buffers in the memory circuit generates its own address transition detection pulse ATDx which serves as an input to a corresponding n-channel pull-down transistor Qx in a summing circuit 20. The output of the summing circuit 20 is buffered by an inverter 21 to generate the global output signal "ATDglobal". Each address transition detection pulse ATDx pulls down node "ATDlocal" which is then returned to a logic high by a p-channel load transistor 22 upon the termination of the ATDx pulse. Thus, overlapping ATDx signals from the n address buffers 10 in the memory circuit are summed by the summing circuit 20 to generate the composite ATDglobal signal.

SUMMARY OF THE INVENTION

The present invention provides an address transition detection circuit that utilizes CMOS pass-gates, delay chains with NAND gates and a dual-load feedback-controlled mechanism to achieve high speed address transition detection while guaranteeing stable address transition detection during indeterminate external address states. Additionally, separate and individually optimized address transition detection circuits are provided for address buffers which result in address transitions in and out of currently selected blocks of a segmented memory for fast access times.

An address transition detection circuit in accordance with the present invention provides an ATD pulse in response to either a high-to-low or low-to-high external address transition. The address transition detection circuit includes an address buffer that translates an externally applied address signal into an internal address signal and its logical complement. Each of these two internal signals is fed through an associated delay chain. The outputs of the two delay chains are connected to the gate of an n-channel pull-down transistor, the drain of which serves as the ATDlocal node of a dual-load feedback-controlled ATD pulse generator. The ATDlocal node is common to address buffers that select memory cells within a particular memory block. Address buffers responsible for switching between blocks have separate feedback-controlled ATD pulse generators in order to optimize the access time of the device. Address transitions detected at the first and second stages of the address input buffer cause the delay-chain circuits to generate a high-going pulse at the gate of the pull-down transistor which, in turn, activates the feedback controlled pulse generator. The width of the ATDx pulse depends upon the time-delay introduced by the inverters and capacitors in the delay chain which, in combination with the delay in the feedback circuit, regulates the width of the pulse at the ATDlocal node. Addresses that cause memory cells to be selected in blocks outside the currently selected memory block generate their own address transition detection pulses in a similar manner based on optimized delay, The local and block ATDs are NANDed together to generate a global output signal.

Other features and advantages of the present invention will become apparent and be appreciated by reference to the following detailed description of the invention which should be considered in conjunction with the accompanying drawings.

BRIEF DESCRIPTION OF DRAWINGS

FIG. 1A is a schematic diagram illustrating a conventional address transition detection summing circuit utilizable with the FIG. 1 circuit.

FIG. 2 is a schematic diagram illustrating a CMOS address buffer and address transition detection circuit in accordance with the present invention.

FIG. 2A is a schematic diagram illustrating an address transition detection summing circuit utilizable with the FIG. 2 circuit.

DETAILED DESCRIPTION OF THE INVENTION

Figure 1:
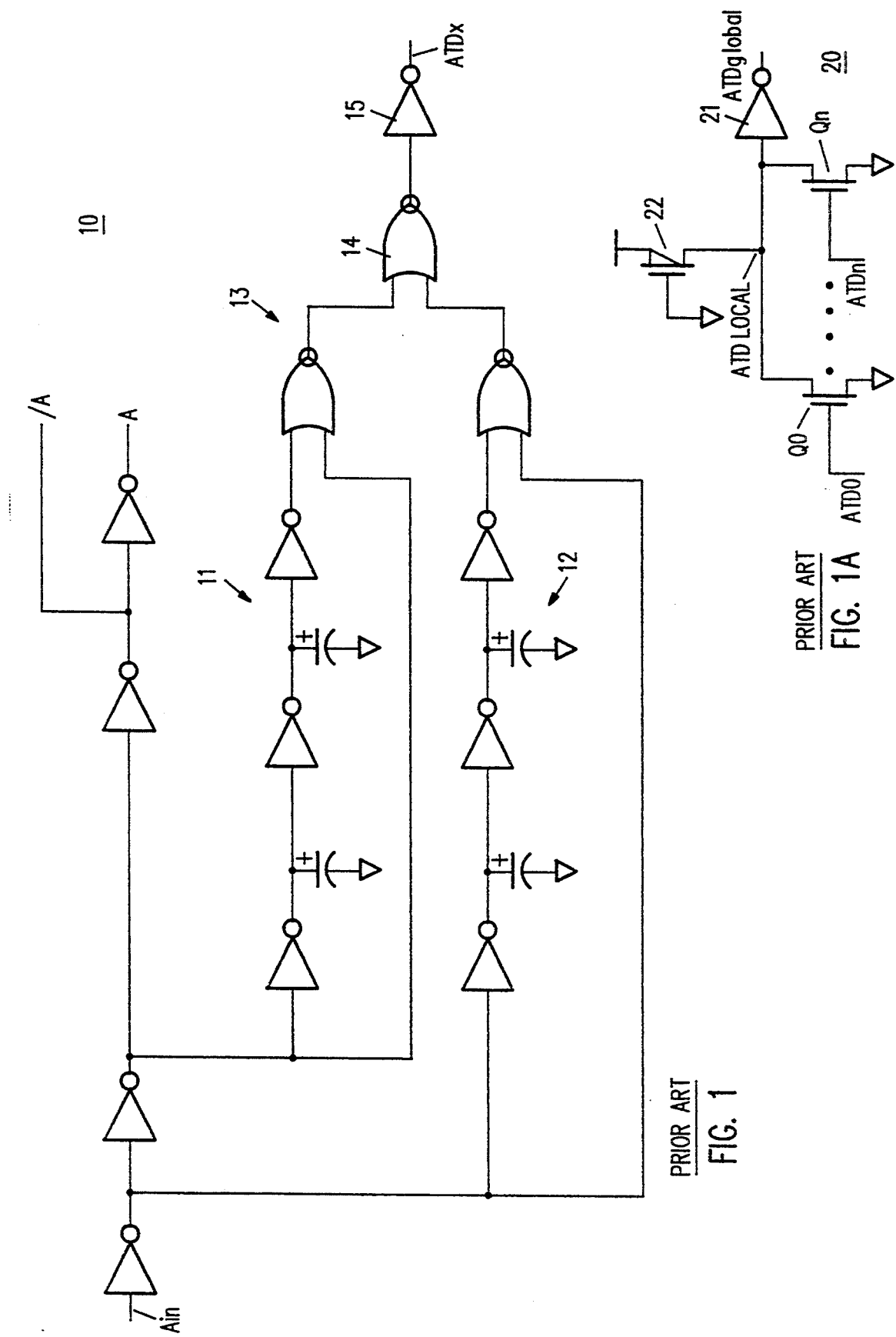
FIG. 1 is a schematic diagram illustrating a conventional address buffer and address transition detection circuit.

FIG. 2 shows an address transition detection circuit 100 that includes an address input buffer 102 that translates an externally applied address input signal Ain into an internal address signal A and its logical complement /A. As described below, output nodes 1 and 2 of the first inverter stage 104 and the second inverter stage 106, respectively, of the address input buffer 102 are used to provide an address transition detection pulse ATDx.

The signal at node A is fed into a first delay chain 108 that includes two series-connected inverters I1 and I2, the outputs of which are loaded by capacitors C1 and C2, respectively. Node A and the output of inverter I2, i.e. node C, drive a NAND gate N1. The output of NAND gate N1, i.e. node D, serves as the input to a CMOS pass-gate that includes an n-channel transistor M1 and a p-channel transistor M2. The output of the pass-gate, i.e. node E, drives an n-channel pull-down transistor M5. The drain of transistor M5 is connected to the ATDlocal node of an address transition detection summing circuit 200, an embodiment of which is shown in FIG. 2A and described in greater detail below. The gates of the pass-gate transistors M1 and M2 are driven by nodes A and B, respectively.

Similarly, the signal at node B is fed into a second delay chain 110 that includes inverters I3 and I4, capacitors C3 and C4, NAND gate N2 and a CMOS pass-gate that includes n-channel transistor M3 and p-channel transistor M4. The output of NAND gate N2, i.e. node F, servers as the input to the M3/M4 pass gate. The output of this pass-gate is also provided to the gate of the pull-down transistor M5. The gates of pass-gate transistors M3 and M4 are driven by nodes B and A, respectively.

FIG. 2A shows a feed-back controlled summing circuit 200 utilizable with the FIG. 2 ADT circuit 100.

As in the case of the conventional summing circuit 20 shown in FIG. 1A, the summing circuit 200 utilizes an address transition detection pulse ATDn received from each of the n address buffers in the memory circuit to drive a corresponding n-channel pull-down transistor (Mn). The output of the summing circuit 200, i.e. node ATDlocal, is buffered by an inverter I5, also in a manner similar to the FIG. 1A circuit 20. However, the output of the buffer inverter I5 is provided to a network of series-connected inverters I6/I7/I8. The outputs of inverters I6 and I7 are loaded by capacitors C6 and C7, respectively. The output of inverter I5 is coupled to the gate of a PMOS pull-up transistor M8 which is connected between the ATDlocal node and the circuit's positive supply. The output of inverter I8 is connected to the gate of a second PMOS transistor M7 which is connected between the ATDlocal node and the positive supply.

Figure 3:
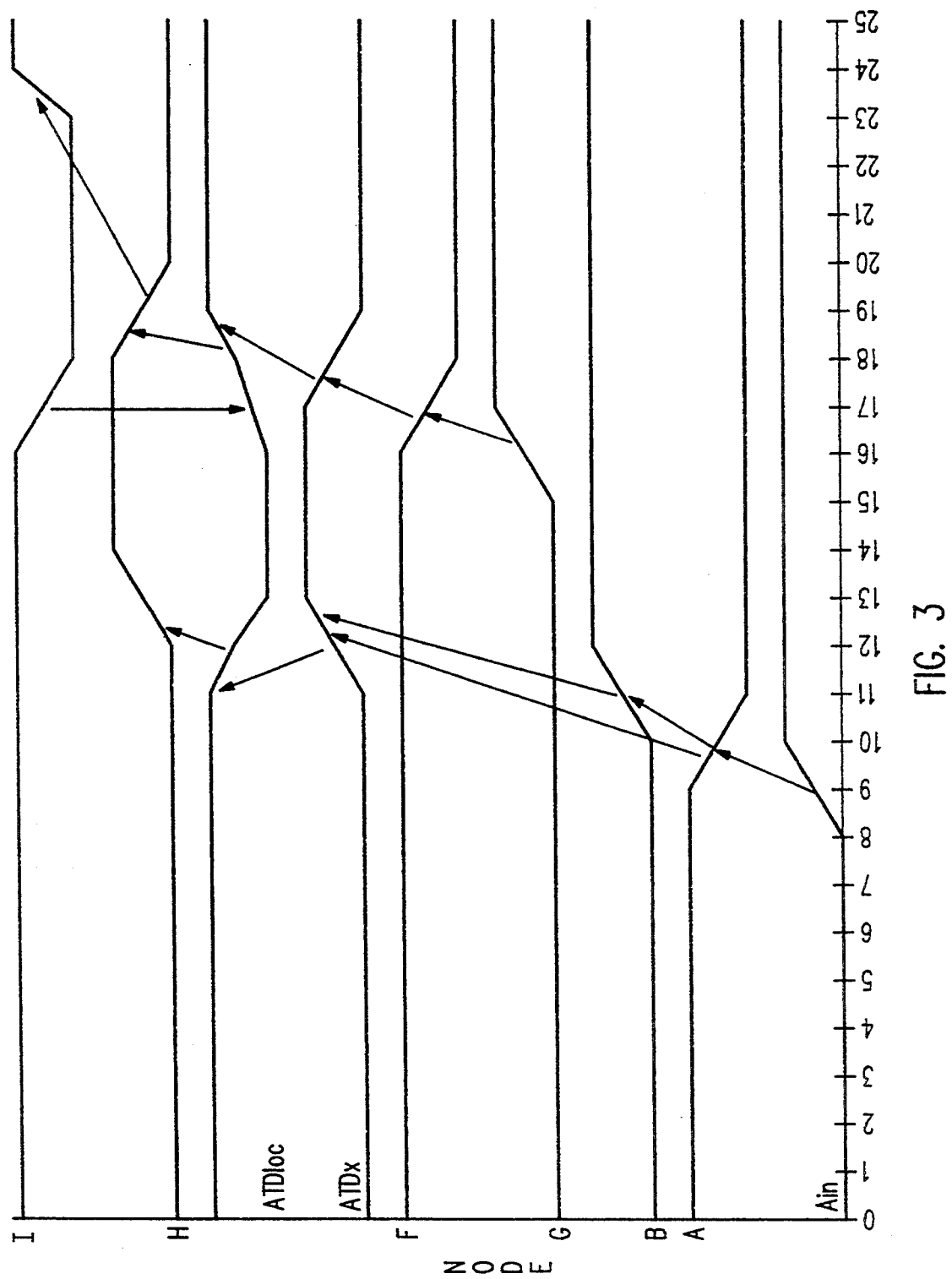
FIG. 3 is a timing diagram illustrating the operation of the FIG. 2 address transition detection circuit.

FIG. 3 shows the logic states and relative time delays associated with various nodes of the FIG. 2 address transition detection circuit 100 and the FIG. 2A summing circuit 200.

Consider the case of a low-to-high transition of the externally applied address input signal Ain. When address signal Ain is low, nodes A and C are high and nodes B and G are low, resulting in the output of NAND gate N1 being low and the output of NAND gate N2 being high. With these condition at nodes A and B, pass-gate M1/M2 is on and pass-gate M3/M4 is off. The address transition detection signal ATDx is, therefore, held low. This prevents the ATDlocal node of the FIG. 2A summing circuit 200 from being pulled low.

As soon as address input signal Ain transitions high, the low going transition on node A turns transistor M1 off and turns transistor M4 on. Since the output of NAND gate N2 is still high, the address transition detection signal ATDx is pulled high immediately. At the same time, the low at node A forces the output of NAND gate N1 high, thereby assisting in forcing signal ATDx high.

NAND gates N1 and N2, therefore, assure that the address transition detection signal ATDx will be held high during the transition times of nodes A and B. This is particularly significant since the state of the address input signal Ain may not be well defined if the external address bus remains in an indeterminate state for any period of time, a common occurrence in applications where the address bus "floats" while switching between two or more bus masters.

During the indeterminate states of the external address input signal Ain, it is necessary to ensure the presence of the ATDx high pulse in order to guarantee that all of the critical nodes and buses in the memory remain equalized and stable.

When a stable low on node A forces node B high, transistor M2 shuts off and transistor M3 turns on, the latter helping to reinforce the high ATDx pulse. At this time, transistors M1 and M2 are off and transistors M3 and M4 are on. After the time delay introduced by the inverter/capacitor network I3/C3/I4/C4, node G in the FIG. 2 circuit 100 goes high forcing the output of NAND gate N2 low. This terminates the ATDx pulse. The pulse-width of the ATDx signal is, therefore, defined by the delay of network I3/C3/I4/C4.

Prior to the occurrence of the ATDx pulse, the ATDlocal node of the FIG. 2A feed-back controlled summing circuit 200 is high, node H is low and node I is high. Thus, p-channel transistor M8 is on and p-channel transistor M7 is off. The presence of transistor M8 guarantees that the ATDlocal node is held high in quiescence. The combination of transistors M7 and M8 further guarantees that the ATDlocal node has a pull-up to return the signal at the node to a high level when no ATDx pulse is present since these transistors are driven by logically complementary signals, i.e. a dual-load feedback-controlled circuit. As soon as the ATDx signal turns transistor M5 on, the ATDlocal node is pulled low since transistor M5 is a much stronger transistor than transistor M8. When the ATDlocal node is pulled below the threshold of inverter I5, node H goes high turning transistor M8 off. Transistor M5 can then pull the ATDlocal node down without restraint. Node I goes low after the time-delay of the inverter network I6/I7/I8 and turns transistor M7 on. Transistor M7 then attempts to pull the ATDlocal node high; if the ATDx pulse has terminated i.e. gone low, then transistor M7 can return the ATDlocal node to a high state freely. If the ATDx signal is still high, then the relative strengths of transistors M5 and M7 will determine the level of the ATDlocal node.

In above-described embodiment, it is assumed that transistor M5 is of significantly higher gain than transistor M7. Hence, the ATDlocal node will remain below the threshold of inverter I5 until the ATDx pulse terminates. Once the ATDx pulse has terminated, transistor M7 will pull the signal at the ATDlocal node high, node H will go low turning transistor M8 on, and after some delay, node I will go high turning transistor M7 off. This completes the ATDlocal signal generation cycle. As those skilled in the art will appreciate, other address transitions causing any of the ATDx pulses to go high will continue to get summed into the ATDlocal signal.

Figure 4:
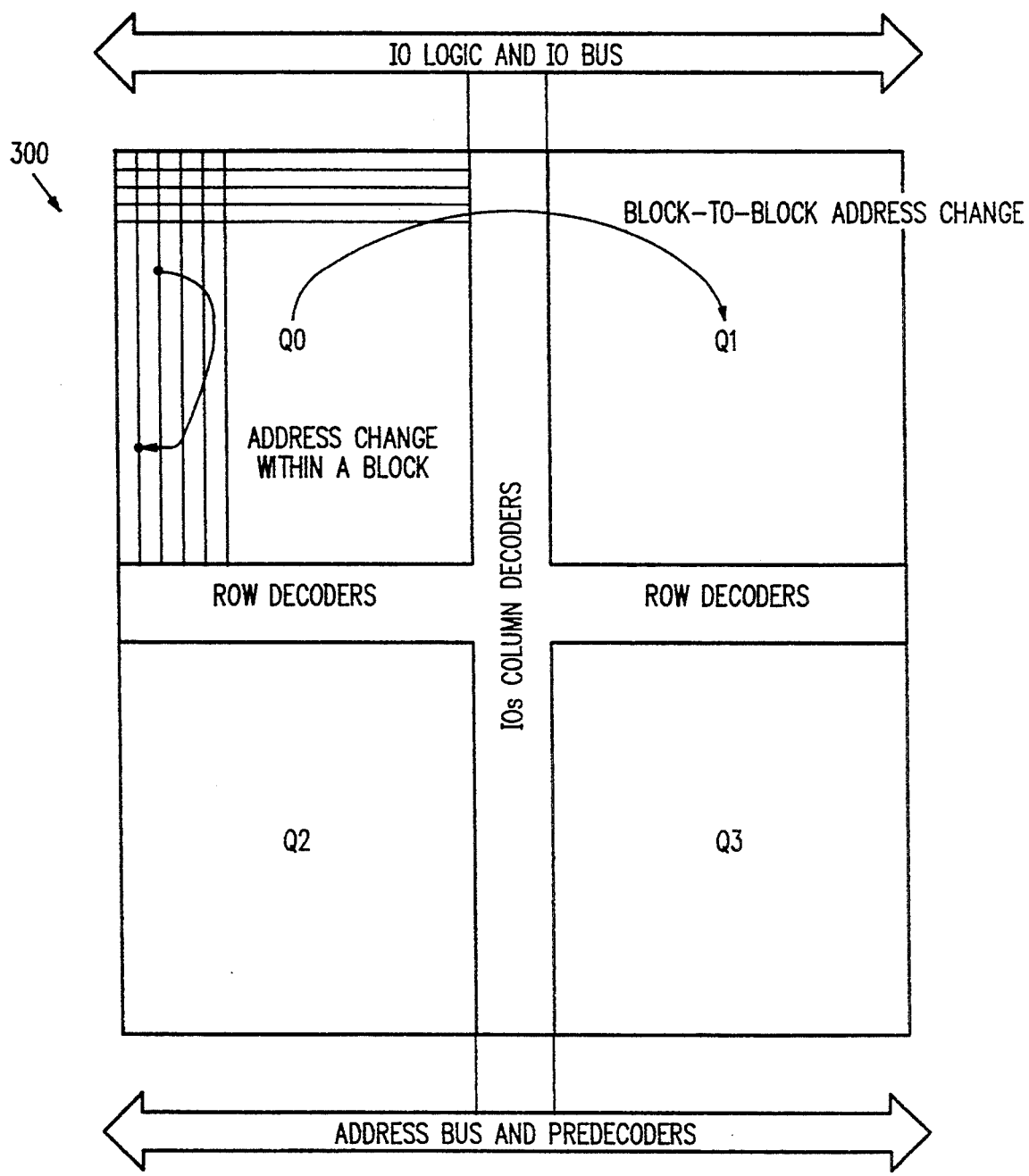
FIG. 4 is a block diagram illustrating a memory device segmented into four blocks (quadrants) of n rows and m columns each.
Figure 5:
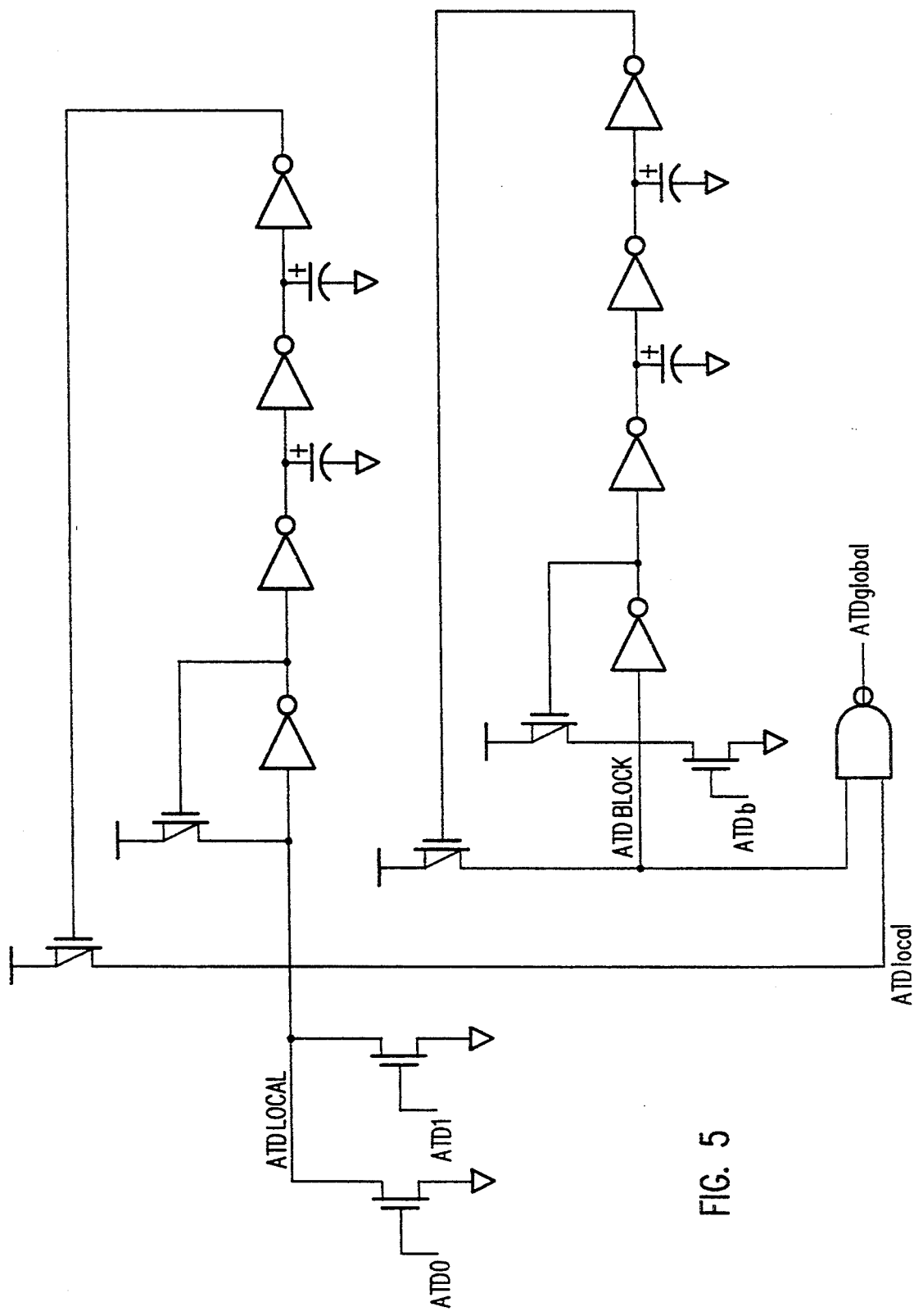
FIG. 5 is a schematic diagram illustrating a hierarchical address transition detection circuit in accordance with the present invention.

FIG. 4 shows a segmented memory 300, an architecture commonly used in contemporary high performance memory circuits. The memory 300 has been divided into four quadrants Q0–Q3 with each quadrant consisting of m rows and n columns of memory cells. A specific memory cell is accessed at the intersection of the selected row and column. The addressing scheme is such that a row and a column in only one of the quadrants will be selected at any time. When an address transition results in a new memory cell being accessed within a quadrant as the previously accessed memory cell, an ATDlocal signal is generated. The pulse-width requirements of this ATDlocal signal can, therefore, be regulated by the address buffers and address transition detection circuits that cause intraquadrant address changes. When an address transition causes a new quadrant to be accessed, the pulse width of ATDblock can be regulated by the block-address buffers. Since the pulse-width requirements of ATDlocal and ATDblock are typically different, ATDglobal can be optimized for fastest access by individually optimizing ATDlocal and ATDblock and then NANDing these signals to produce ATDglobal. This scheme, called the hierarchical ATD scheme, is shown in FIG. 5. The circuit configurations and operation of the local and block ATDs are identical, the only difference being in the delays and, thus, in the pulse-widths generated by their respective address buffers and address transition detectors.

It should be understood that various alternatives to the embodiments of the invention described herein may be employed in practicing the invention. It is intended that the following claims define the scope of the invention and that methods and circuits within the scope of these claims and their equivalents be covered thereby.

What is claimed is:

1. An address buffer circuit comprising:
an address input buffer that translates an externally applied address input signal into an internal address signal and a logical complement of the internal address signal;
a first delay stage that includes
 (i) a pair of series-connected first stage inverters that receives the internal address signal and provides a delayed internal address signal;
 (ii) a first stage NAND gate that responds to the internal address signal and the delayed internal address signal at first and second inputs, respectively, to provide a first stage NAND gate output signal; and
 (iii) a first stage pass gate that includes a first stage n-channel transistor having its drain connected to receive the first stage NAND gate output signal, its source connected to an internal address transition detection node and its gate connected to receive the internal address signal, and a first stage p-channel transistor having its source connected to receive the first stage NAND gate output signal, its drain connected to the internal address detection node and its gate connected to receive the logical compliment of the internal address signal;
a second delay stage that includes
 (i) a pair of series-connected second stage inverters that receives the logical compliment of the internal address signal and provides a delayed logical compliment signal;
 (ii) a second stage NAND gate that responds to the logical compliment of the internal address signal and the delayed logical compliment signal at first and second inputs, respectively, to provide a second stage NAND gate output signal; and
 (iii) a second stage pass gate that includes a second stage n-channel transistor having its drain connected to receive the second stage NAND gate output signal, its source connected to the internal address transition detection node and its gate connected to receive the logical compliment of the internal address signal and a second stage p-channel transistor having its source connected to receive the second stage NAND gate output signal, its drain connected to the internal address transition detection node and its gate connected to receive the internal address signal; and
an n-channel pull-down transistor having its source connected to ground, its gate connected to the internal address transition detection node and its drain connected to provide a local address transition detection signal at a local address transition detection node.

2. An address transition detection circuit for detecting a logic transition of any one of the address bits of an externally-applied, multi-bit address input signal, the address transition detection circuit comprising:
(a) for each of the address bits of said externally-applied, multi-bit address input signal,
 (i) an address input buffer that translates said address bit into an internal address signal and a logical compliment of the internal address signal;
 (ii) a first delay stage that includes
  a pair of series-connected first stage inverters that receives the internal address signal and provides a delayed internal address signal;
  a first stage NAND gate that responds to the internal address signal and the delayed internal address signal at first and second inputs, respectively, to provide a first stage NAND gate output signal;
  a first stage pass gate that includes a first stage n-channel transistor having its drain connected to receive the first stage NAND gate output signal, its source connected to an internal address detection node and its gate connected to receive the internal address signal, the first stage pass gate further including and a first stage p-channel transistor having its source connected to receive the first stage NAND gate output signal, its drain connected to the internal address detection node and its gate connected to receive the logical compliment of the internal address signal; and
 (iii) a second delay stage that includes
  a pair of series-connected second stage inverters that receives the logical compliment of the internal address signal and provides a delayed logical compliment signal;
  a second stage NAND gate that responds to the logical compliment of the internal address signal and the delayed logical compliment signal at first and second inputs, respectively, to provide a second stage NAND gate output signal; and a second stage pass gate that includes a second stage n-channel transistor having its drain connected to receive the second stage NAND gate output signal, its source connected to the internal address transition detection node and its gate connected to receive the logical compliment of the internal address signal, the second stage pass gate further including a second stage p-channel transistor having its source connected to receive the second stage NAND gate output signal, its drain connected to the internal address transition detection node and its gate connected to receive the internal address signal; and (iv) an n-channel pull-down transistor having its source connected to ground, its gate connected to the internal address detection transition node and its drain connected to provide a local address transition detection signal at a local address transition detection node, the local address transition detection node being common to the n-channel pull-down transistor associated with each address bit; and (b) a feed-back controlled summing circuit that includes (i) a first p-channel pull-up transistor having its source connected to a positive supply terminal and its drain connected to the local address transition detection node;

(ii) a second p-channel pull-up transistor having its source connected to the positive supply terminal and its drain connected to the local address transition detection node; and (iii) first, second, third and fourth feedback inverters connected in series, each of said feedback inverters having an input node and an output node, the input node of the first feedback inverter being connected to the local address transition detection node, the output node of the first feedback inverter being connected to the gate of the second p-channel pull-up transistor, and the output of the fourth feedback inverter being connected to the gate of the first p-channel pull-up transistor.

3. In a memory device that includes an array of memory storage cells that is segmented into a plurality of storage cell blocks, each storage block including rows and columns of memory storage cells, each memory storage cell within the array being accessible utilizing an externally-applied, multi-bit address input signal, the address input signal including at least one most significant bit (msb) that identifies a selected storage cell block within the array and a plurality of least significant bits (lsb) that identify a selected memory storage cell within the selected storage cell block, an address transition detection circuit for detecting a logic transition of any one of the address bits of the externally-applied, multi-bit address input signal, the address transition detection circuit comprising:

(a) for each of the lsb bits of said externally-applied, multi-bit address input signal, (i) an address input buffer that translates said lsb bit into an internal address signal and a logical compliment of the internal address signal;

(ii) a first delay stage that includes a pair of series-connected first stage inverters that receives the internal address signal and provides a delayed internal address signal, the pair of series-connected first stage inverters having a local delay time associated therewith;

a first stage NAND gate that responds to the internal address signal and the delayed internal address signal at first and second inputs, respectively, to provide a first stage NAND gate output signal;

a first stage pass gate that includes a first stage n-channel transistor having its drain connected to receive the first stage NAND gate output signal, its source connected to a local internal address detection node and its gate connected to receive the internal address signal, the first stage pass gate further including and a first stage p-channel transistor having its source connected to receive the first stage NAND gate output signal, its drain connected to the local internal address detection node and its gate connected to receive the logical compliment of the internal address signal; and (iii) a second delay stage that includes a pair of series-connected second stage inverters that receives the logical compliment of the internal address signal and provides a delayed logical compliment signal, the pair of series-connected second stage inverters having the local delay time associated therewith;

a second stage NAND gate that responds to the logical compliment of the internal address signal and the delayed logical compliment signal at first and second inputs, respectively, to provide a second stage NAND gate output signal; and a second stage pass gate that includes a second stage n-channel transistor having its drain connected to receive the second stage NAND gate output signal, its source connected to the local internal address transition detection node and its gate connected to receive the logical compliment of the internal address signal, the second stage pass gate further including a second stage p-channel transistor having its source connected to receive the second stage NAND gate output signal, its drain connected to the local internal address transition detection node and its gate connected to receive the internal address signal; and (iv) an n-channel pull-down transistor having its source connected to ground, its gate connected to the local internal address detection transition node and its drain connected to provide a local address transition detection signal at a local address transition detection node, the local address transition detection node being common to the n-channel pull-down transistor associated with each lsb bit;

(b) a local feed-back controlled summing circuit that includes (i) a first p-channel pull-up transistor having its source connected to a positive supply terminal and its drain connected to the local address transition detection node;

(ii) a second p-channel pull-up transistor having its source connected to the positive supply terminal and its drain connected to the local address transition detection node; and (iii) first, second, third and fourth feedback inverters connected in series, each of said feedback inverters having an input node and an output node, the input node of the first feedback inverter being connected to the local address transition detection node, the output node of the first feedback inverter being connected to the gate of the second p-channel pull-up transistor, and the output of the fourth feedback inverter being connected to the gate of the first p-channel pull-up transistor; and (c) for each of the at least one msb bits of said externally-applied, multi-bit address input signal, (i) an address input buffer that translates said msb bit into an internal address signal and a logical compliment of the internal address signal;

(ii) a first delay stage that includes a pair of series-connected first stage inverters that receives the internal address signal and provides a delayed internal address signal, the pair of series-connected first stage inverters having a block delay time associated therewith;

a first stage NAND gate that responds to the internal address signal and the delayed internal address signal at first and second inputs, respectively, to provide a first stage NAND gate output signal;

a first stage pass gate that includes a first stage n-channel transistor having its drain connected to receive the first stage NAND gate output signal, its source connected to a block internal address detection node and its gate connected to receive the internal address signal, the first stage pass gate further including and a first stage p-channel transistor having its source connected to receive the first stage NAND gate output signal, its drain connected to the block internal address detection node and its gate connected to receive the logical compliment of the internal address signal; and (iii) a second delay stage that includes a pair of series-connected second stage inverters that receives the logical compliment of the internal address signal and provides a delayed logical compliment signal, the pair of series-connected second stage inverters having the block delay time associated therewith;

a second stage NAND gate that responds to the logical compliment of the internal address signal and the delayed logical compliment signal at first and second inputs, respectively, to provide a second stage NAND gate output signal; and a second stage pass gate that includes a second stage n-channel transistor having its drain connected to receive the second stage NAND gate output signal, its source connected to the block internal address transition detection node and its gate connected to receive the logical compliment of the internal address signal, the second stage pass gate further including a second stage p-channel transistor having its source connected to receive the second stage NAND gate output signal, its drain connected to the block internal address transition detection node and its gate connected to receive the internal address signal; and (iv) an n-channel pull-down transistor having its source connected to ground, its gate connected to the block internal address detection transition node and its drain connected to provide a block address transition detection signal at a block address transition detection node, the block address transition detection node being common to the n-channel pull-down transistor associated with each msb bit; and (d) a block feed-back controlled summing circuit that includes (i) a first p-channel pull-up transistor having its source connected to a positive supply terminal and its drain connected to the block address transition detection node;

(ii) a second p-channel pull-up transistor having its source connected to the positive supply terminal and its drain connected to the block address transition detection node; and (iii) first, second, third and fourth feedback inverters connected in series, each of said feedback inverters having an input node and an output node, the input node of the first feedback inverter being connected to the block address transition detection node, the output node of the first feedback inverter being connected to the gate of the second p-channel pull-up transistor, and the output of the fourth feedback inverter being connected to the gate of the first p-channel pull-up transistor; and (e) a global NAND gate that receives the local address transition detection signal at a first input and the block address transition detection signal at a second input and provides a global address transition detection signal as an output.

* * * * *